US007599677B2

(12) United States Patent
Chien

(10) Patent No.: US 7,599,677 B2
(45) Date of Patent: Oct. 6, 2009

(54) CHARGE PUMP CIRCUIT HAVING SWITCHES

(75) Inventor: Hung-Ming Chien, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 565 days.

(21) Appl. No.: 10/813,266

(22) Filed: Mar. 31, 2004

(65) Prior Publication Data

US 2005/0221780 A1    Oct. 6, 2005

(51) Int. Cl.
    *H04B 1/06* (2006.01)
(52) U.S. Cl. .................. 455/260; 455/262; 455/333; 327/157; 327/537; 375/345
(58) Field of Classification Search ........... 455/205, 455/208, 209, 230, 255–260, 264, 262, 317, 455/318, 333; 375/373–376, 345; 331/1 R, 331/17, 18, 25; 327/108, 111, 155, 156, 327/374, 376, 377, 534, 537
    See application file for complete search history.

(56) References Cited

U.S. PATENT DOCUMENTS

| 4,636,748 | A | * | 1/1987 | Latham, II | 331/17 |
| 5,623,523 | A | * | 4/1997 | Gehrke | 375/376 |
| 6,140,881 | A | * | 10/2000 | Kim | 331/20 |
| 6,259,714 | B1 | * | 7/2001 | Kinbara | 372/38.02 |
| 6,384,668 | B2 | * | 5/2002 | Kuroda | 327/536 |
| 6,430,244 | B1 | * | 8/2002 | Ryu | 375/376 |
| 6,437,637 | B2 | * | 8/2002 | Myono | 327/536 |
| 6,563,726 | B1 | * | 5/2003 | Hirst | 363/127 |
| 6,714,772 | B2 | * | 3/2004 | Kasahara et al. | 455/260 |
| 6,724,265 | B2 | * | 4/2004 | Humphreys | 331/17 |
| 6,806,759 | B2 | * | 10/2004 | Stortz | 327/536 |
| 6,819,187 | B1 | * | 11/2004 | Ming et al. | 331/17 |
| 6,850,111 | B1 | * | 2/2005 | Ausserlechner | 327/536 |
| 6,952,124 | B2 | * | 10/2005 | Pham | 327/156 |
| 7,064,600 | B1 | * | 6/2006 | Ming et al. | 327/536 |
| 2002/0181252 | A1 | * | 12/2002 | Hosotani et al. | 363/18 |
| 2003/0142521 | A1 | * | 7/2003 | Hosotani et al. | 363/100 |
| 2003/0143950 | A1 | * | 7/2003 | Maldonado | 455/17 |
| 2003/0215041 | A1 | * | 11/2003 | Gauthier et al. | 375/376 |
| 2004/0090215 | A1 | * | 5/2004 | Ishii et al. | 323/225 |
| 2004/0227496 | A1 | * | 11/2004 | Hosotani et al. | 323/282 |
| 2005/0156684 | A1 | * | 7/2005 | Chiu | 331/185 |
| 2006/0049867 | A1 | * | 3/2006 | Kawai | 327/536 |

FOREIGN PATENT DOCUMENTS

EP    1 351 396 A1    10/2003
WO    WO 00/33464    6/2000

* cited by examiner

*Primary Examiner*—Nhan T Le
(74) *Attorney, Agent, or Firm*—Sterne, Kessler, Goldstein & Fox PLLC.

(57) ABSTRACT

A charge pump circuit that supplies current to an offset current of an output signal for an oscillating circuit is disclosed. The charge pump circuit includes a first switch and a second switch. The first switch is coupled to a gate of an output diode that provides a charge up current from the charge pump circuit. A second switch is coupled to an anode of the output diode and supplies the charge up current to the output diode. The first switch comprises a first state and the second switch comprises a second state that is opposite the first state. Thus, when the second switch is on, the first switch is off. The charge pump circuit also includes a capacitance to hold a bias voltage when the first switch is off.

15 Claims, 3 Drawing Sheets

CHARGE PUMP CIRCUIT HAVING SWITCHES

BACKGROUND OF THE INVENTION

1. Field of the Invention

The present invention relates to the control and operation of oscillating circuits using a charge pump, and more particularly, the present invention relates to a charge pump that improves linearity within a circuit coupled to an oscillating circuit that supplies an offset current.

2. Description of the Related Art

Oscillating circuits, such as voltage controlled oscillators, can operate at certain frequencies. The control circuits for oscillating circuits may include a charge pump and a phase shift circuit. The phase shift circuit may be implemented in a radio frequency (RF) transceiver as a phase locked loop. A voltage controlled oscillator (VCO) may be used to implement the phase locked loop and to produce an oscillation from a reference frequency.

Phase locked loops may be used in wireless communication and direct communication devices. Data may be modulated onto at least one RF carrier frequency and transmitted as a modulated signal by a transmitter. A receiver may receive the RF modulated signal, and demodulates it to recapture the data.

In conventional communication devices, the antenna section receives RF modulated signals and provides them to the filtering section. The filtering section passes the RF signals of interest to a low noise amplifier. The low noise amplifier amplifies the received RF signals of interest and provides them as amplified signals to an intermediate frequency (IF) stage. The IF stage may include one or more oscillators.

In many applications, the output frequency of a basic phase locked loop should be adjustable. Within these types of phase locked loops, linearity of the components that generate the output signals is desirable. Non-linearity introduced into the components may cause distortion, or create spurs and raise the noise floor. By raising the noise floor, additional noise is introduced into the loop, which in turn degrades performance. Adjustability of the output frequency also is degraded such that performance of the communication device, wireless or direct, is less efficient in locking to the desired frequency or requires additional resources to reduce noise.

SUMMARY OF THE INVENTION

According to the preferred embodiments, a charge pump circuit to supply current to a controlled oscillating circuit is disclosed. The charge pump circuit includes a first switch comprising a first state. The first switch is coupled to a gate of an output diode. The charge pump circuit also includes a second switch comprising a second state opposite from the first state, the second switch coupled to an anode of the output diode. The second switch provides a charge up current to the output diode when the second state comprises an ON state.

According to the preferred embodiments, a circuit also is disclosed. The circuit includes a controlled oscillator controlled by an output signal having an offset current. The circuit also includes a charge pump circuit to add a charge up current to the offset current in response to a signal from a phase/frequency detector. The charge pump circuit comprises a first switch having a first state and a second switch having a second state to add the charge up current to the offset current, in which the first state is opposite the second state. The circuit also includes an output diode coupled to the first and second switches to provide the charge up current to the offset current.

According to the preferred embodiments, a charge pump circuit coupled to an oscillating circuit also is disclosed. The charge pump circuit includes a current source. The charge pump circuit also includes a source switch coupled to the current source to supply a charge up current. The charge pump circuit also includes an output diode having an anode coupled to the source switch. The output diode receives the charge up current. The charge pump circuit also includes a gate switch coupled to a gate of the output diode to form a circuit to hold a bias voltage from the gate.

According to the preferred embodiments, a method for adding a charge up current is disclosed. The method includes setting a first switch coupled to a gate of an output diode to a first state. The method also includes setting a second switch coupled to an anode of the output diode to a second state. The second state is opposite the first state. The second switch provides a charge up current for the output diode.

According to the preferred embodiments, a circuit for adding a charge up current also is disclosed. The circuit includes first setting means for setting a first switch coupled to a gate of an output diode to a first state. The circuit also includes second setting means for setting a second switch coupled to an anode of the output diode to a second state. The second state is opposite the first state. The second switch provides a charge up current to the output diode.

BRIEF DESCRIPTION OF THE DRAWINGS

For proper understanding of the invention, reference should be made to the accompanying drawings, wherein.

DETAILED DESCRIPTION OF THE PREFERRED EMBODIMENTS

Reference will now be made in detail to the disclosed embodiments, examples of which are illustrated in the accompanying drawings.

Figure 1:
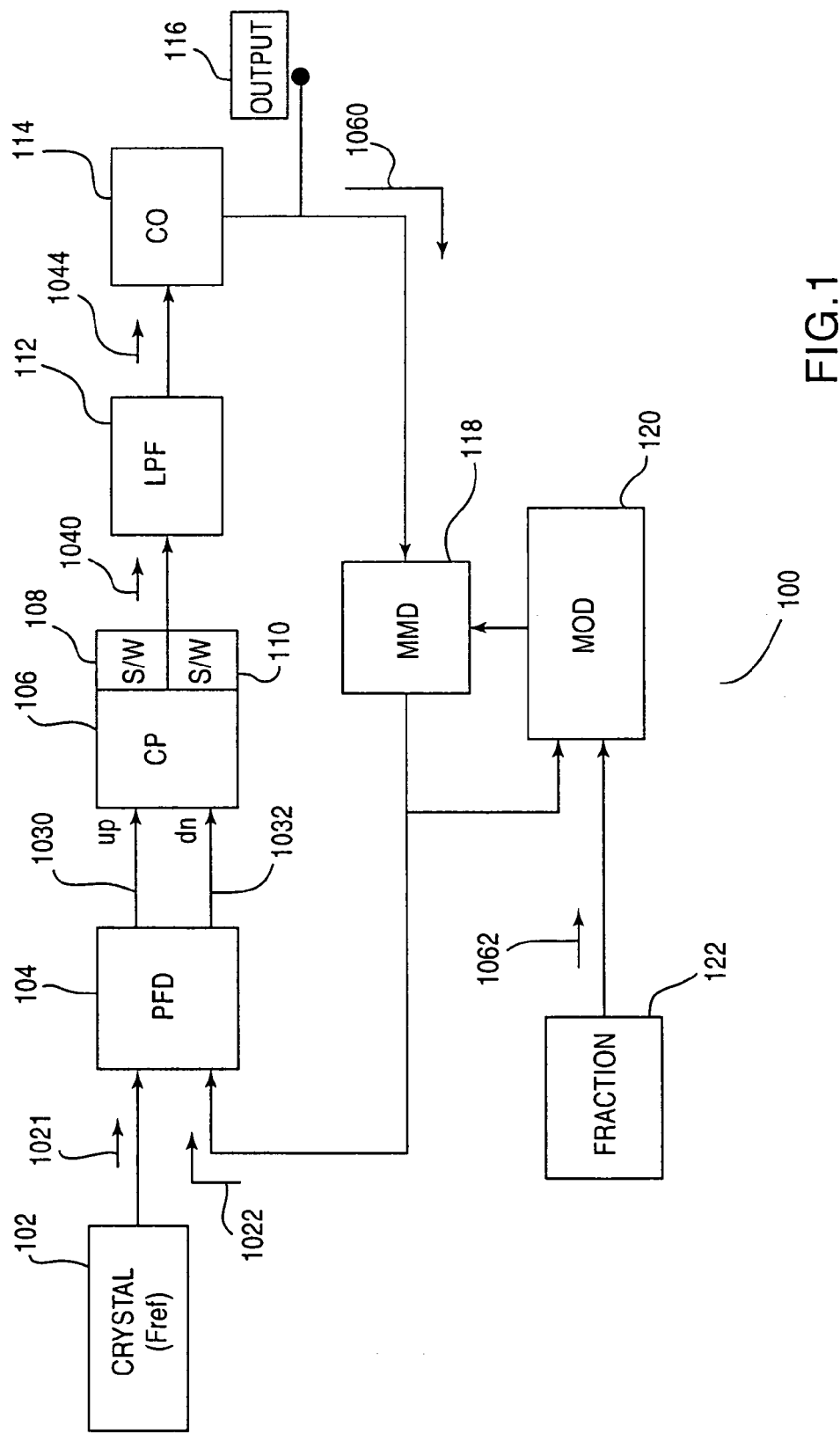
FIG. 1 illustrates a circuit having an offset current at a charge pump according to the preferred embodiments.

FIG. 1 depicts a circuit 100 having an offset current at a charge pump 106 according to the preferred embodiments. Circuit 100 may be a fractional synthesizer used in a wireless transceiver. Circuit 100 may provide flexibility to the wireless transceiver. Circuit 100 also may be referred to as a phase locked loop (PLL) circuit implemented as a fractional synthesizer.

Circuit 100 includes a crystal oscillator 102 that generates a reference signal 1021. Preferably, reference signal 1021 of crystal oscillator 102 may be greater than 10 MHz. Reference signal 1021 may be received by phase/frequency detector 104. Phase/frequency detector 104 also may receive feedback signal 1022. Phase/frequency detector 104 generates a signal that represents a phase difference and/or frequency difference between reference signal 1021 and feedback signal 1022. Phase/frequency detector 104 generates either an up-differential signal 1030 or a down-differential signal 1032. Differential signals 1030 and 1032 indicate a phase and/or frequency difference between reference signal 1021 and feedback signal 1022 to charge pump 106.

Charge pump 106 reacts to differential signals 1030 or 1032 by generating either a charge up current or a charge down current. The charge up and charge down currents may be added to an offset current which, in turn, is added to output signal 1040. Charge pump 106 also includes switches 108 and 110. Preferably, if one switch of charge pump 106 is in a particular state, then the other switch is in an opposite state. For example, the switch 108 is on, such that charge or current is flowing through switch 108, then switch 110 is off.

Circuit 100 also includes low pass filter 112. Low pass filter 112 filters output signal 1040 to produce a filtered signal 1044. Low pass filter 112 passes filtered signal 1044 to controlled oscillator 114. Controlled oscillator 114 generates an output signal 116 according to filtered signal 1044. Output signal 116 may have a frequency specified by circuit 100

Feedback reference signal 1060 also may be generated. Multi-modulus divider (MMD) 118 receives feedback reference signal 1060. Feedback reference signal 1060 corresponds to output signal 116, and may be used as a basis for determining whether output signal 116 may be at, above or below the desired frequency of circuit 100. By determining any difference between the desired frequency and the frequency of output signal 116, circuit 100 may adjust itself to output the desired frequency. MMD 118 generates feedback signal 1022 that seeks to have a frequency approximately equal to reference signal 1021. Feedback signal 1022 is generated by dividing feedback reference signal 1060 by a number received by MMD 118. MMD control module 120 controls MMD 118. MMD control module 120 is coupled to MMD 118 and determines the divider value, or number, to divide feedback reference signal 1060.

Fractional generator 122 generates a divide ratio having an integer part and a fractional part. The divide ratio may be determined by dividing the frequency of reference signal 1021 into the desired frequency. The resulting determination may not be a whole number. MMD 118, however, uses integers to divide feedback reference signal 1060. Thus, any fractional part is accounted for by modulator 120. Divide ratio 1062 is received by modulator 120. Modulator 120 generates a modulated integer output for the fractional part. Preferably, modulator 120 is a delta-signal modulator that generates a modulated integer output with a range from −3 to +4. The output of modulator 120 is added to the integer value of divide ratio 1062 to control MMD 118. MMD 118 changes its divide ratio between n−3 to n+4, with the average divide ratio equal to the integer part in the integer output of modulator 120. Thus, modulator 120 modulates MMD 118 to generate frequency fluctuation. Frequency fluctuation is integrated to show up as phase error at the input of phase/frequency detector 104.

When the phase of reference signal 1021 and feedback signal 1022 is approximately equal, circuit 100 may act as a phase locked loop. For example, the desired frequency of output signal 116 may be produced by circuit 100. If the phase and/or frequency of reference signal 1021 differs from the phase and/or frequency of feedback signal 1022, then phase/frequency detector 104 produces signals 1030 or 1032, accordingly, to increase or decrease the frequency of output signal 116. Circuit 100 may adjust itself to maintain the PLL.

In many wireless applications, circuit 100 may provide adjustable local oscillation. MMD 118, modulator 120 and fractional generator 122 may be referred to as a selectable divider feedback circuit that is capable of producing divider values that include an integer portion and a fractional portion. For example, MMD 118 may receive an integer value from modulator 120. Fractional generator 122 may randomize divide ratio signal 1062 such that MMD 118 divides feedback reference signal 1060 by different numbers. For example, instead of having a divider number of 30, MMD 118 may have divide numbers of 28, 29, 30, 31, and 32. Thus, modulator 120 may provide a randomized signal 1062 based upon a fractional part from fractional generator 122.

Preferably, circuit 100 and its components operate in a linear manner. Linearity of the resultant signals may allow circuit 100 to adjust output frequency 116. For example, non-linearity within charge pump 106 may affect charge up output signal 1040. Charge pump 106 may create a mismatch between up and down current and between rise time and fall time of the up and down current due to non-linearity. Small portions of the phase difference detected by phase/frequency detector 104 and signal 1040 may not have a linear relationship. Charge pump 106 may modify its output to account for these non-linear regions. An offset current may be added to the output of charge pump 106, and, thus, to signal 1040.

Thus, when circuit 100 is locked, the phase between reference signal 1021 and feedback signal 1022 may become a non-zero value in order to cancel offset current added at the output of charge pump 106. Because of the non-zero phase between reference signal 1021 and reference feedback signal 1022 from MMD 118, charge pump 106 may utilize only one side of current, either up-current only or down-current only, and the region around the zero phase is avoided. Further, an offset current may be generated by charge pump 106 to get a non-linear region as close to being linear as possible. The offset current also may be injected to the output of charge pump 106 at the bias charge pump at more linear regions. Typical causes of non-linearity within charge pump 106 includes current mismatch and gain variation around zero phase error. Non-linear conditions in charge pump 106 may create spurs and may raise the noise floor, which in turn degrades performance of circuit 100. Further, errors within charge pump 106 may result in a magnitude error of output current 116.

Thus, charge pump 106 pumps current into its output signal. For example, the current may be pumped when switch 108 is in an ON state. Further, switch 110 may be in an OFF state during this phase.

Figure 2:
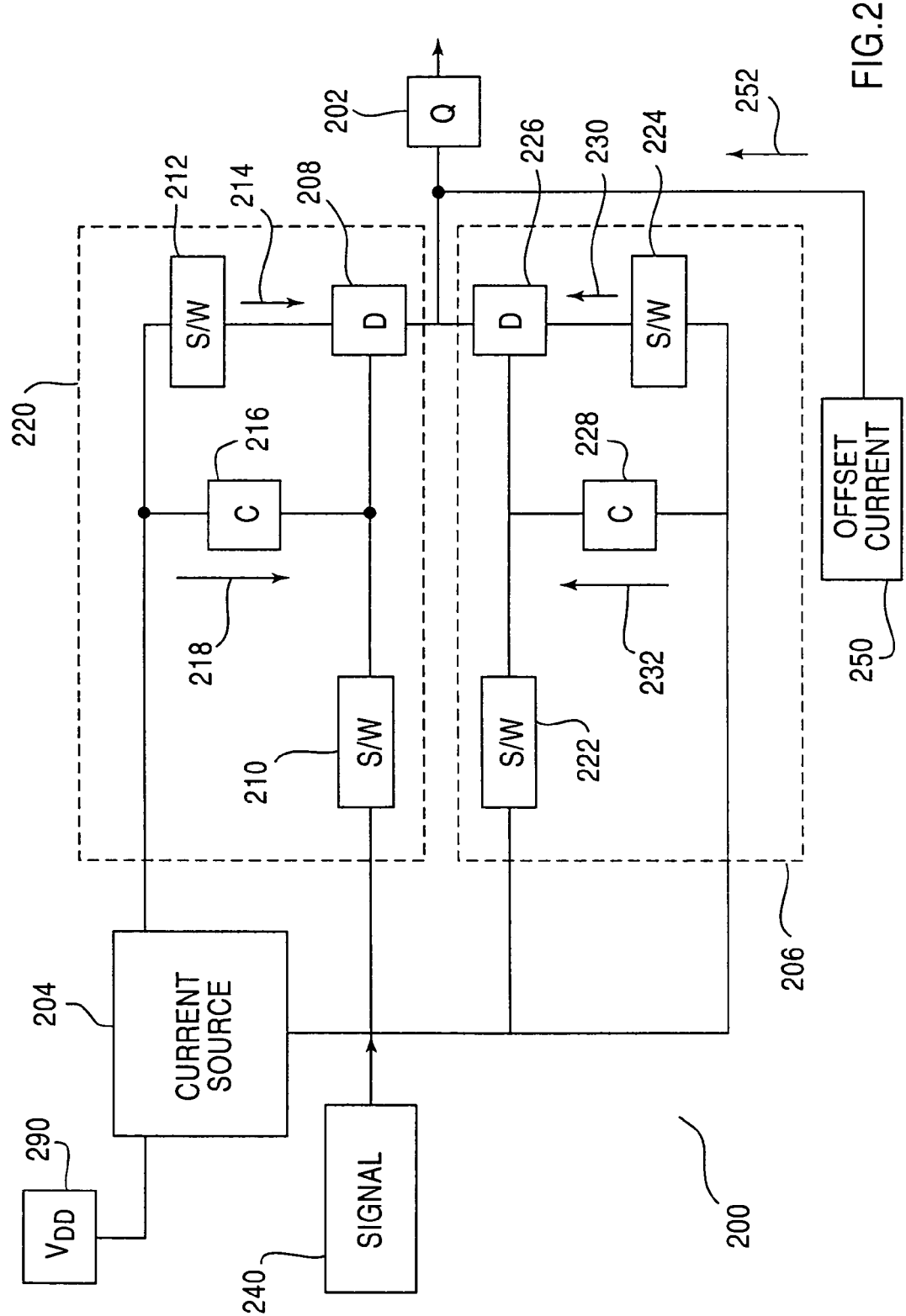
FIG. 2 illustrates a charge pump for supplying charge up current to an offset current according to the preferred embodiments.

FIG. 2 depicts a charge pump 200 for supplying a charge up current 214 according to the preferred embodiments. Charge pump 200 may correlate to charge pump 106, shown in FIG. 1. Charge pump 106, however, is not limited by the disclosure of charge pump 200 in FIG. 2.

Charge pump 200 provides output signal 202 to a controlled oscillator, such as controlled oscillator 114 in FIG. 1. Output signal 202 may include an offset current 252 having charge up current 214 or charge down current 230. In the following discussion, output signal 202 may include charge up current 214 that adjusts the output frequency of the controlled oscillator coupled to charge pump 200.

Charge pump 200 may include current source 204, charge up circuit 220, charge down circuit 206 and offset current circuit 250. Additional components of charge pump 200 may be any components, devices and the like of conventional charge pumps. Current source 204 is coupled to charge up circuit 220 for supplying charge up current 214. Current source 204 is coupled to supply voltage, or $V_{DD}$, 290. For example, current source may use supply voltage 290 in supplying charge up current 214.

Charge up circuit 220 also includes switch 210 and switch 212. When switch 212 is in an ON state, charge up current 214 may be supplied to output diode 208 from current source 204. Switch 210 may be in an OFF state as charge up current 214 is supplied. When switch 212 is in an OFF state, charge up current 214 may not be supplied, and switch 210 may be in an ON state. Switches 210 and 212 may turn ON and OFF instantaneously. Switch 210 may be referred to as a gate switch, and switch 212 may be referred to as a source switch.

Switches 210 and 212 may be comprised of different semiconductor materials. For example, switch 212 may include a p-channel metal oxide semiconductor (PMOS), while switch 210 includes an n-channel metal oxide semiconductor (NMOS). For example, by being different semiconductor materials, the process of being in opposite states may be facilitated. Further, switch 210 is connected to the bias source of current source 204. Switch 210 also may connect to capacitance 216 to form a "sample and hold" circuit.

For example, switch 210 may be disconnected, or in an OFF state, when current source 204 is supplying charge up current 214 to reduce potential drift of charge up current 214. A bias voltage 218 may be held by capacitance 216 connected to switch 210. When current source 204 finishes supplying charge up current 214, switch 212 is turned to an OFF state. Switch 212 may be located on a supply side of current source 204 to reduce any effects for injecting, or supplying, charge up current 214. For example, modulation may be reduced, or eliminated, in these components of charge pump 200.

Capacitance 216 may be a capacitor. Capacitance 216 may be a metal oxide semiconductor (MOS) capacitor. When capacitance 216 is open, a sample and hold circuit may be created with switch 210. Bias voltage 218 is kept, or held, by capacitance 216. The voltage 218 is held according to a long time constant to prevent additional charge from leaking into charge up current 214.

Thus, the time constant value holding bias voltage 218 within capacitance 216 is increased so that charge up current 214 appears constant while output diode 208 is ON. Variations within charge up current 214 are avoided because switch 210 is disconnected, or in an OFF state, when output diode 208 is ON to reduce any drift of charge up current 214. Bias voltage 218 may be held by capacitance 216 connected to switch 210. The resulting current slope non-linearity may be reduced so as to appear constant by the long time constant of capacitance 216.

When current source 204 is turned OFF, switch 212 may revert back to an OFF state and the charge for charge up current 214, may be held by capacitance 216 until switch 212 is turned ON again.

Current source 204 may operate when signal 240 from phase/frequency detector 104, as shown in FIG. 1, indicates the need to provide charge up current 214. In other words, current source 204 is ON when injecting positive current into output current 202.

Thus, charge pump 200 is coupled to a controlled oscillating circuit to adjust frequency of an output signal in a fractional synthesizer. Components within the fractional synthesizer are preferably linear and the present invention seeks to remove non-linearity from charge pump 200 and charge up current 214 to allow a more efficient adjustment of the speed of the coupled controlled oscillating circuit. A time constant for charge up circuit 220 may be increased, or almost made infinite, by using switches 210 and 212. Thus, the resulting transfer function of charge pump 200 may be linear.

Charge up circuit 220, in summary, includes a first switch 210 having a first state and coupled to a gate of output diode 208. Charge up circuit 220 also includes second switch 212 having a second state that is opposite from the first state of switch 210. Second switch 212 may be coupled to the anode of output diode 208 and supplies charge up current 214 to offset current 252 while first switch 210 is in an OFF state.

Current source 204 also is coupled to charge down circuit 206 for supplying charge down current 230. Charge down circuit 206 includes switch 222 and switch 224, which act like switches 210 and 212 discussed above. When switch 224 is in an ON state, charge down current 230 may be supplied to output diode 226. Output diode 226 may be similar to output diode 208. Switch 222 may be in an OFF state as charge down current 230 is supplied. When switch 224 is in an OFF state, charge down current 230 may not be supplied, and switch 222 may be in an ON state. Switches 222 and 224 may turn ON and OFF instantaneously. Switch 222 may be referred to as a gate switch, and switch 224 may be referred to as a source switch.

Within charge down circuit 206, switch 222 may be disconnected, or in an OFF state, when current source 204 is supplying charge down current 230. As in charge up circuit 220, a bias voltage 232 may be held by capacitance 228 connected to switch 222. Switch 224 may be on a supply side of current source 204 to reduce any effects for injecting, or supplying, charge down current 230. Capacitance 228 may be a capacitor. When capacitance 228 is open, a sample and hold switch may be created with switch 222. Bias voltage 232 is kept, or held, by capacitance 228.

When current source is turned OFF, switch 224 may revert back to an OFF state and the charge for charge down current 230 may be held by capacitance 228 until switch 224 is turned ON again. Current source 204 may operate when signal 240 from phase/frequency detector 104, as shown in FIG. 1, indicates the need to provide charge down current 230.

Offset current 252 may determine the amount of phase offset at the input of phase/frequency detector 104, for example, when a circuit is in a PLL configuration, or "in lock." If an NMOS is used to provide a dc current to the output of charge pump 200, the phase offset may be positive, which activates a charge up circuit 220 when the PLL is in a "lock state." Alternatively, if a PMOS is used to provide the dc current to the output of charge pump 200, then the phase offset may be negative, which activates charge down circuit 206 when the PLL is in a "lock state." Offset current circuit 250 provides the dc current that comprises offset current 252. A value for the dc current may be programmable, while values of the charge up and charge down currents may be dynamic, or changeable.

Figure 3:
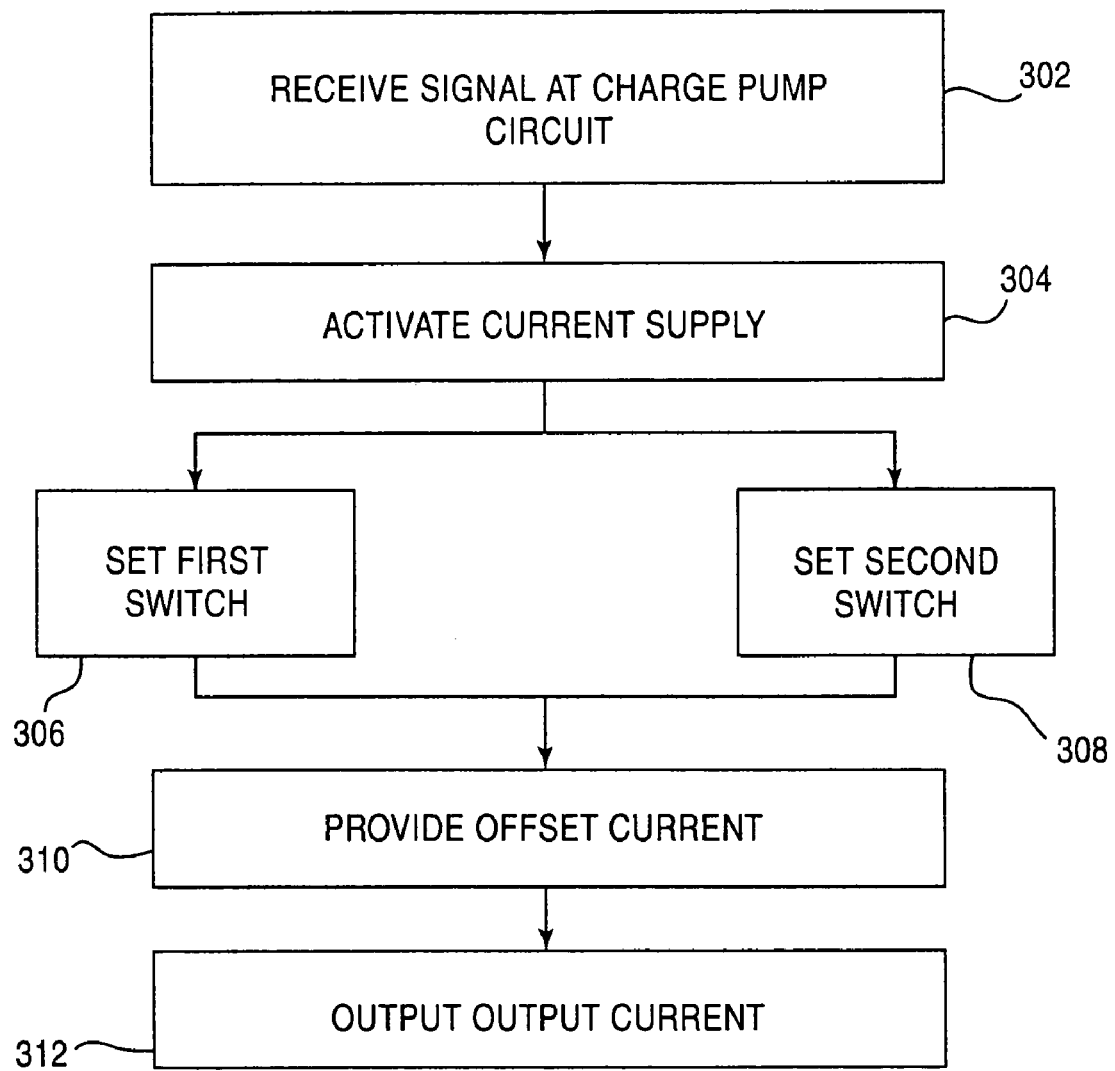
FIG. 3 illustrates a flowchart for adding charge up current to an offset current according to the preferred embodiments.

FIG. 3 depicts a flowchart adding a charge up current according to the preferred embodiments. Step 302 executes by receiving a signal at a charge pump circuit. The charge pump circuit may be coupled to an oscillating circuit. The signal may indicate whether the charge pump circuit is to add a charge up current to an offset current at an input to the oscillating circuit. Alternatively, the charge pump circuit may withdraw current to be input to the oscillating circuit via a charge down current.

Step 304 executes by activating a current supply within the charge pump circuit. The current supply may be coupled to two switches also within the charge pump circuit. The current supply generates current to be used as the charge up current. Step 306 executes by setting a first switch within the charge pump circuit. The first switch is set to a state, such as ON or OFF. Step 308 executes by setting the second switch to a state opposite to the state of the first switch. When providing the charge up current from the charge pump circuit, the state of the second switch is set to ON. Thus, the state of the first switch may be OFF. Both the first and second switches may be coupled to an output diode. The first switch may be coupled to a gate of the output diode, while the second switch may be coupled to the anode of the output diode. The output diode, in turn, is coupled to the input of the oscillating circuit.

Step 310 executes by providing the charge up current to the output diode through the second switch. The second switch allows the charge up current from the current supply of the charge pump circuit to flow into the output diode. The first switch may be decoupled from the output diode such that any bias signals, such as current or voltage, does not flow into the output diode. Step 312 executes by outputting the output current having the offset current to the oscillating circuit. The charge up current in the offset current provided above may be added to the output current to adjust the oscillating circuit accordingly. The offset current may be added to the output current via the output diode. Reference may be made to FIGS. 1 and 2 in implementing the flowchart of FIG. 3. FIG. 3, however, is not limited to the embodiments disclosed with reference to FIGS. 1 and 2. For example, a first switch and a second switch may be set accordingly within any charge pump circuit configuration known to one skilled in the art.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims and their equivalents.

I claim:

1. A charge pump circuit to supply current to a controlled oscillating circuit, the charge pump circuit comprising:
   a first switch comprising a first state, said first switch coupled to a gate of an output diode; and
   a second switch comprising a second state opposite from said first state, the second switch coupled to an anode of the output diode,
   wherein the second switch is configured to provide a charge up current to the output diode when the second state comprises an ON state,
   wherein the first switch is coupled to a capacitance configured to hold a bias when the second state comprises the ON state, and
   wherein the output diode is configured to provide the charge up current to an offset current.

2. The charge pump circuit of claim 1, wherein the first switch comprises a diode having a first semiconductor material.

3. The charge pump circuit of claim 1, wherein the second switch comprises a diode having a second semiconductor material.

4. The charge pump circuit of claim 1, wherein the first switch disconnects the gate of the output diode when said first state comprises an OFF state.

5. The charge pump circuit of claim 1, wherein the first switch comprises an n-channel metal oxide semiconductor.

6. The charge pump circuit of claim 1, wherein the second switch comprises a p-channel metal oxide semiconductor.

7. A circuit, comprising:
   an oscillator controlled by a current; and
   a charge pump circuit that generates the current in response to a signal, wherein the charge pump circuit includes:
   a first switch comprising a first state, said first switch coupled to a gate of an output diode; and
   a second switch comprising a second state opposite from said first state, the second switch coupled to an anode of the output diode,
   wherein the second switch is configured to provide the current to the output diode when the second state comprises an ON state,
   wherein the first switch is coupled to a capacitance configured to hold a bias when the second state comprises the ON state, and
   wherein the output diode is configured to provide the current to the oscillator.

8. The circuit of claim 7, wherein the current is a charge up current.

9. The circuit of claim 7, wherein the current is a charge down current.

10. The circuit of claim 7, further comprising a low pass filter coupled between the oscillator and the charge pump circuit.

11. The circuit of claim 7, further comprising a phase/frequency detector coupled to charge pump circuit and configured to provide the signal.

12. The circuit of claim 11, further comprising a multi-modulus divider coupled between the phase/frequency detector and the oscillator.

13. The circuit of claim 12, wherein the multi-modulus divider is configured to output a feedback signal.

14. The circuit of claim 12, wherein the charge pump circuit includes a time constant applied by the first switch.

15. The circuit of claim 14, wherein a period for the time constant for the first switch is greater than a period for the ON state for the second switch.

* * * * *

UNITED STATES PATENT AND TRADEMARK OFFICE
CERTIFICATE OF CORRECTION

PATENT NO. : 7,599,677 B2 Page 1 of 1
APPLICATION NO. : 10/813266
DATED : October 6, 2009
INVENTOR(S) : Hung-Ming Chien It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1099 days.

Signed and Sealed this

Twenty-eighth Day of September, 2010

David J. Kappos
*Director of the United States Patent and Trademark Office*